(12) United States Patent
Lee et al.

(10) Patent No.: US 7,192,864 B2
(45) Date of Patent: Mar. 20, 2007

(54) METHOD OF FORMING INTERCONNECTION LINES FOR SEMICONDUCTOR DEVICE

(75) Inventors: Kyoung-Woo Lee, Seoul (KR); Hong-Jae Shin, Seoul (KR); Jae-Hak Kim, Seoul (KR); Young-Jin Wee, Seongnam-si (KR); Seung-Jin Lee, Suwon-si (KR); Ki-Kwan Park, Haeundae-gu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 11/049,730

(22) Filed: Feb. 4, 2005

(65) Prior Publication Data

US 2005/0176236 A1 Aug. 11, 2005

(30) Foreign Application Priority Data

Feb. 11, 2004 (KR) ...................... 10-2004-0009120

(51) Int. Cl.
 *H01L 21/4763* (2006.01)
(52) U.S. Cl. ...................... 438/637; 438/672; 438/745; 257/621; 257/E21.597
(58) Field of Classification Search ................ 438/623, 438/637, 638, 645, 672, 675, 745, 750, 618, 438/624, 626, 634, 671, 692, 749; 257/621
See application file for complete search history.

(56) References Cited

U.S. PATENT DOCUMENTS 6,465,358 B1* 10/2002 Nashner et al. ............. 438/700
2005/0029229 A1* 2/2005 Chae et al. .................. 216/67
2006/0012014 A1* 1/2006 Chen et al. ................. 257/635

* cited by examiner

*Primary Examiner*—Quoc Hoang
(74) *Attorney, Agent, or Firm*—Valentine & Whitt, PLLC

(57) ABSTRACT

The present invention discloses a method of fabricating interconnection lines for a semiconductor device. The method includes forming an interlayer insulating layer on a semiconductor substrate. A via hole is formed through the interlayer insulating layer. A via filling material is formed to fill the via hole. A photoresist pattern is formed on the via filling material. The via filling material and the interlayer insulating layer are anisotropically etched using the photoresist pattern as an etch mask to form a trench. A residual portion of the via filling material is removed using two wet etch processes. After removing the residual portion of the via filling material, a conductive layer pattern is formed in the via hole and the trench.

16 Claims, 6 Drawing Sheets

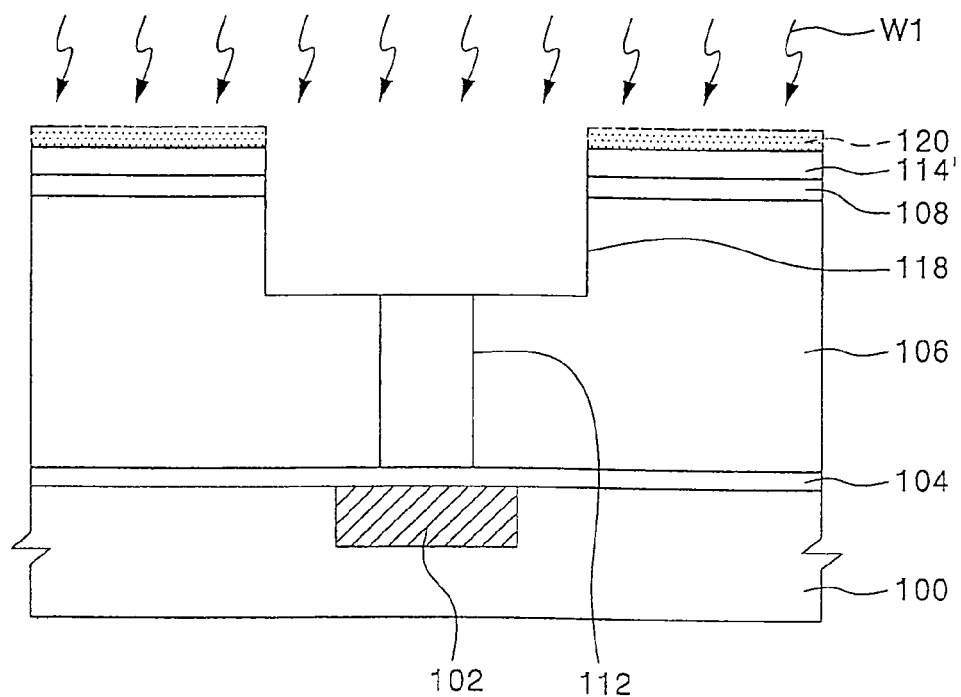
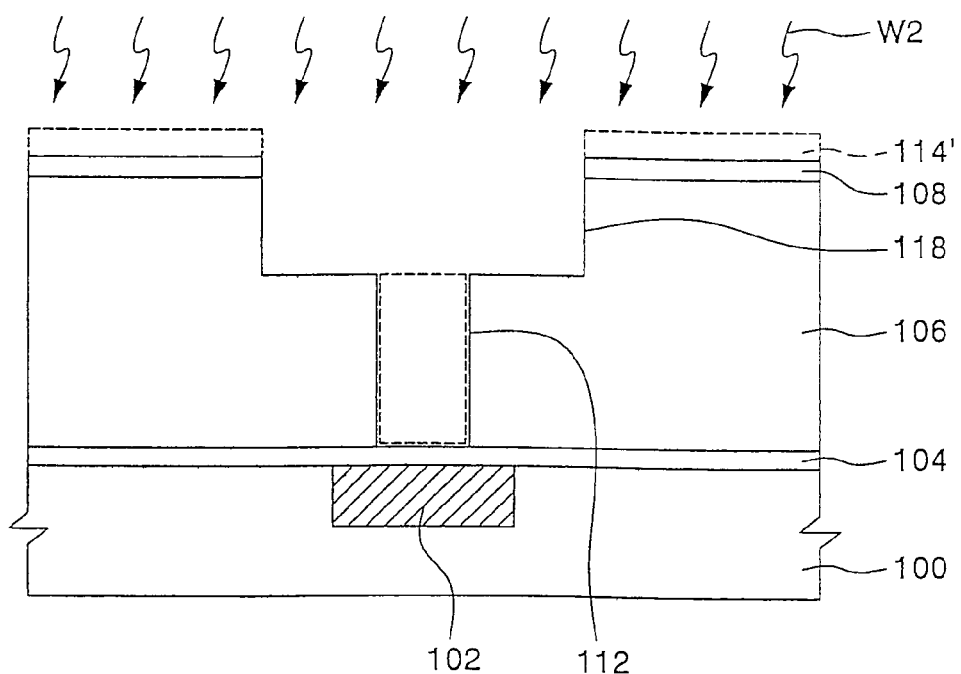

METHOD OF FORMING INTERCONNECTION LINES FOR SEMICONDUCTOR DEVICE

BACKGROUND OF INVENTION

1. Technical Field

The present invention generally relates to a method of fabricating semiconductor devices. More particularly, the present invention generally relates to a method of forming interconnection lines for semiconductor devices.

A claim of priority is made to Korean Patent Application No. 2004-0009120, filed Feb. 11, 2004, the disclosure of which is hereby incorporated by reference in its entirety.

2. Discussion of the Related Art

Higher integrated semiconductor devices demand reliable interconnection lines. Copper (Cu) is a material used for interconnection lines. Copper has a lower resistivity property compared to aluminum (Al). Therefore, the use of copper tends to suppress the RC delays associated with aluminum interconnection lenses. In addition, copper has a relatively high melting point compared to aluminum, and therefore has good relative resistance to electro-migration and stress-migration.

Conventionally, a dual damascene process is used to form copper interconnection lines. Advantages of the dual damascene process include the formation of multilayered metal interconnection lines and contacts between interconnection lines at the same time with no step height differences due to metal interconnection lines. The dual damascene processes include (1) a first via hole fabrication, and (2) a first trench fabrication. Generally, the first via fabrication is used because the size of a via hole can be maintained even if a double misalignment occurs during fabrication. A conventional dual damascene process is disclosed, for example, in U.S. Pat. No. 4,789,648.

However, a lower conductive region exposed by a via hole may be damaged during an etch process used to form a trench. Therefore, in order to prevent etch damage, a via hole filling material is formed inside the via hole prior to application of the trench forming etch process. A conventional dual damascene process employing such a via filling material is disclosed, for example, in U.S. Pat. No. 6,057,239.

In the dual damascene process using the via filling material, it is preferable to completely remove the via filling material from the via hole, and possibly from an associated insulating layer, after forming the trench. One method of removing the via filling material by a plasma etch process using carbon tetra fluoride ($CH_4$) as an etch gas is disclosed, for example, in U.S. Pat. No. 5,705,430. Generally, the via filling material can be removed by a wet etch process. If the via filling material is not completely removed, a resulting etch residue on the insulating layer may cause a step height difference in a subsequent chemical-mechanical polishing process. Such a step height difference may cause interconnection lines to be formed in a non-uniform manner. Further, etch residue inside the via hole may cause deterioration in the electrical performance characteristics of the interconnection lines.

SUMMARY OF THE INVENTION

The present invention is directed to provide a method of fabricating interconnection lines for a semiconductor device by forming a conductive layer on a semiconductor substrate, forming an interlayer insulating layer on the conductive layer and on the semiconductor substrate, forming a via hole through the interlayer insulating layer, forming a via filling material on the interlayer insulating layer and in the via hole, forming a photoresist pattern on the via filling material, anisotropically etching the via filling material and the interlayer insulating layer, using the photoresist pattern as an etch mask, so as to form a trench, removing the photoresist pattern by an ashing process, wherein the ashing process converts the surface of the filling material to a carbon depletion region, performing a first wet etch process to remove the carbon depletion region, performing a second wet etch process to remove via filling material, and forming a conductive layer pattern by filling the via hole and the trench with a conductive material.

Also the present invention discloses a method of forming a conductive layer on a semiconductor substrate, forming an interlayer insulating layer on the conductive layer and on the semiconductor substrate, forming a via filling material on the interlayer insulating layer and in the via hole, forming a photoresist pattern on the via filling material, anisotropically etching the via filling material and the interlayer insulating layer, using the photoresist pattern as an etch mask, so as to form a trench, removing the photoresist pattern by an ashing process, wherein the ashing process converts the surface of the filling material to a carbon depletion region, performing a first wet etch process with a solution of Hydrofluoric acid (HF) to remove the carbon depletion region, performing a second wet etch process with a solution of dimethyl acetamide to remove via filling material, and forming a conductive layer pattern by filling the via hole and the trench with a conductive material.

BRIEF DESCRIPTION OF THE DRAWINGS

Aspects of the present invention will become more apparent to those of ordinary skill in the art by the detail description of preferred embodiments with reference to the attached drawings in which:

FIGS. 1 through 7 are cross-sectional views illustrating a method of fabricating interconnection lines for a semiconductor device according to a preferable embodiment of the present invention;

DETAILED DESCRIPTION OF THE INVENTION

Figure 1:
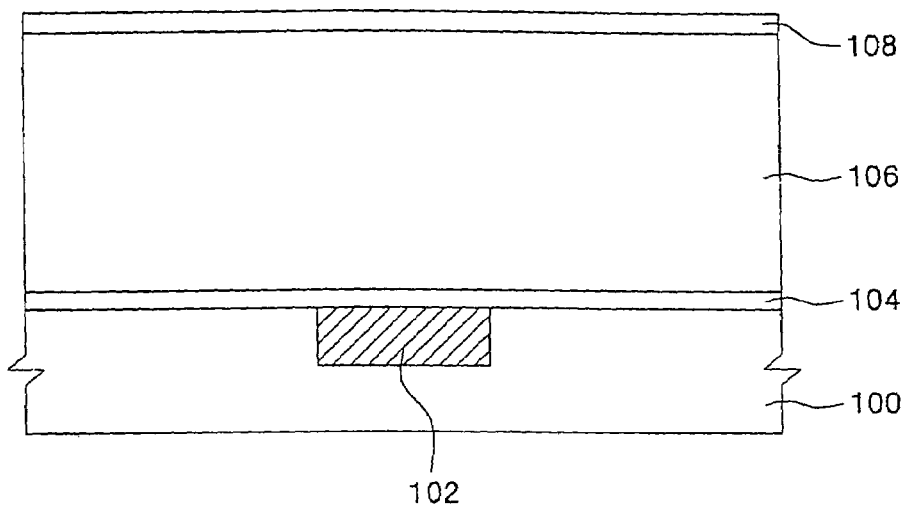

The invention will now be described more fully hereinafter with reference to the accompanying drawings, in which preferred embodiments of the present invention are described. This invention may, however, be embodied in many different forms and should not be construed as being limited to the embodiments set forth herein. Rather, these embodiments are provided as teaching examples. In the drawings, the thicknesses of layers and regions are exaggerated for clarity. Like numbers refer to like elements throughout the specification. It will be understood that when an element such as a layer, a region or a substrate is referred to as being "on" or "onto" another element, it can be directly on the other element or intervening elements may also be present.

FIGS. 1 through 7 are cross-sectional views illustrating a method of fabricating interconnection lines for a semiconductor device according to one embodiment of the present invention.

Referring to FIG. 1, a conductive layer 102 is formed on a semiconductor substrate 100. Conductive layer 102 may be an impurity diffusion layer or a metal interconnection layer of copper. An etch stop layer 104 and an interlayer insulating layer 106 are sequentially formed on semiconductor substrate 100. Etch stop layer 104 is preferably formed of a material having a high etch selectivity relative to interlayer insulating layer 106, such as silicon nitride (SiN), silicon carbide (SiC), or silicon carbide nitride (SiCN). Interlayer insulating layer 106 is preferably formed of a material having a low dielectric constant, which reduces a parasitic capacitance between interconnection lines. Interlayer insulating layer 106 may be formed of organo silicate glass (OSG). A capping layer 108 is formed on interlayer insulating layer 106. Capping layer 108 is formed to prevent interlayer insulating layer 106 from deteriorating in a subsequent dry etch process to form the interconnection lines. Capping layer 108 is preferably formed of undoped silicate glass (USG), fluorinated silicate glass (FSG), or tetra ethyl ortho silicate (TEOS) using, for example, a PECVD method.

Figure 2:
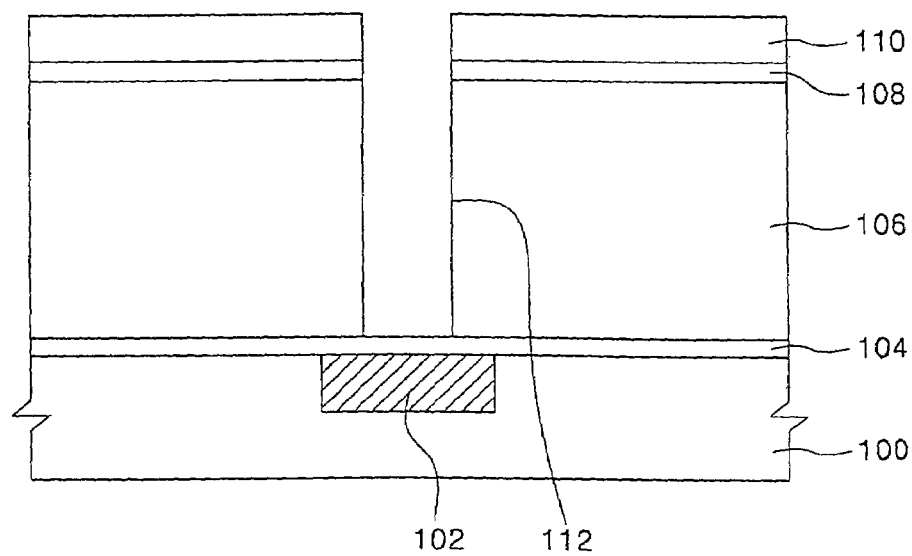

Referring to FIG. 2, a first photoresist pattern 110 having an opening is formed on capping layer 108. Using first photoresist pattern 110 as an etch mask, capping layer 108 and interlayer insulating layer 106 are anisotropically etched. As a result, a via hole 112 is formed extending through capping layer 108 and interlayer insulating layer 106 to expose the etch stop layer 104 on conductive layer 102. Then, first photoresist pattern 110 is removed. First photoresist pattern 110 is preferably removed by an ashing process.

Figure 3:
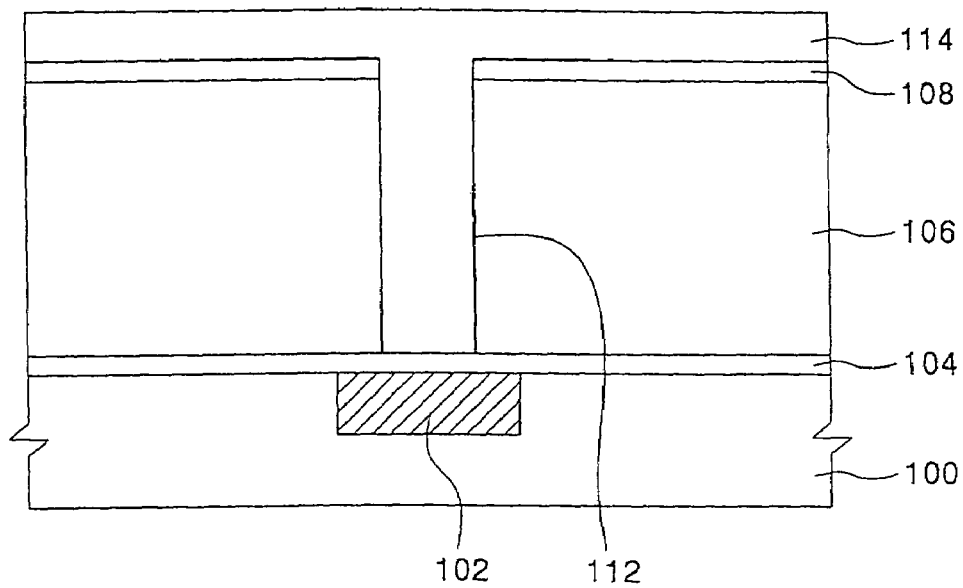

Referring to FIG. 3, a via filling material 114 is formed on the resultant structure to fill via hole 112. Preferably, via filling material 114 has a dry etch rate similar to that of interlayer insulating layer 106, but a higher wet etch rate than that of interlayer insulating layer 106. In the case that interlayer insulating layer 106 is a layer of organic OSG, via filling material 114 is preferably formed from the same organic material. In an embodiment of the present invention, via filling material 114 is organo-siloxane, and is formed on the resulting structure shown, for example, in FIG. 3 using a spin-on method.

Figure 4:
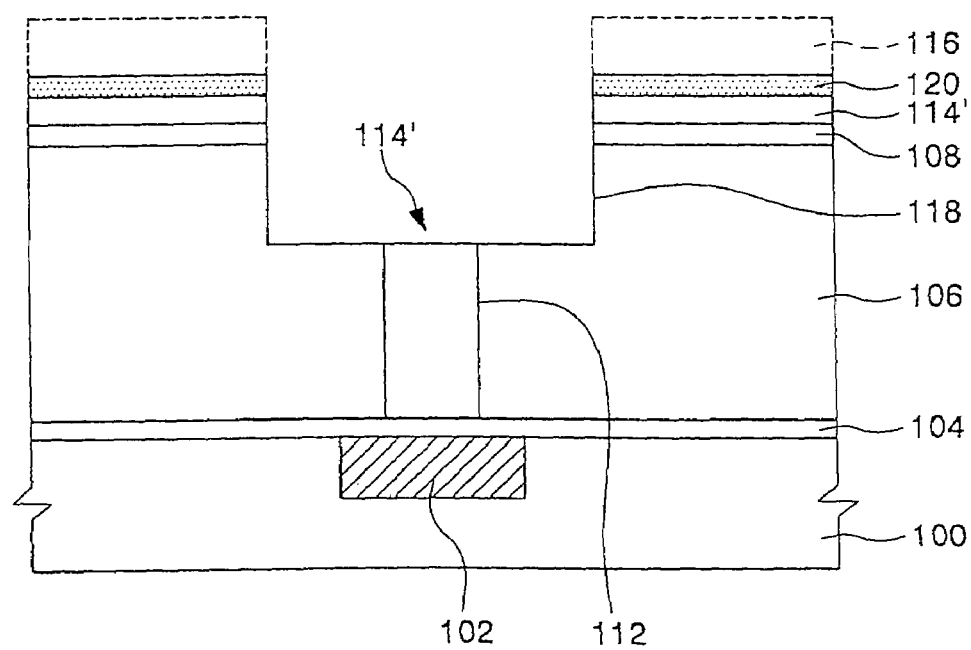

Referring to FIG. 4, a photoresist layer (not shown) is formed on via filling material 114. Then, the photoresist layer is exposed and developed to form a second photoresist pattern 116 having an opening, which overlaps via hole 112. Second photoresist pattern 116 preferably has a width greater than the width of via hole 112. The use of second photoresist pattern 116 in this context has several apparent benefits. Organic compounds called "Amine" from interlayer insulating layer 106 penetrate through into the photoresist layer, thereby preventing the photoresist-poisoning that might otherwise damage the photoresist layers. Further, since the thickness deviation of contemporary photoresist layers is reduced, the margin of a depth of focus is improved.

Using second photoresist pattern 116 as an etch mask, portions of via filling material 114 and portions of interlayer insulating layer 106 are anisotropically etched. As a result, a trench 118, which is connected to via hole 112, is formed on interlayer insulating layer 106. At this point in the fabrication process residual portions of via filling material 114' remain inside via hole 112 and on interlayer insulating layer 106. The residual via filling material 114' with via hole 112 prevents conductive layer 102 from being damaged by the anisotropic etch process used to form trench 118.

Second photoresist pattern 116 may then be removed using an ashing process. During the ashing process, the property of a surface portion of the residual via filling material 114' changes. That is, the ashing process, which employs plasma, damages the surface of residual via filling material 114'. As a result, the portion of residual via filling material 114' damaged by the plasma is changed to siloxane in an example where the via filling material is organo siloxane. The changed portion of the residual via filling material 114' becomes hard a carbon depletion region 120. This change occurs both on the residual portions of the via filling material 114' filling via hole 112 and the residual via filling material pattern 114' remaining on interlayer insulating layer 106. However, the majority of the changes occur on the residual surface patterns of the via filling material 114' remaining on interlayer insulating layer 106.

Referring to FIGS. 5 and 6, residual via filling material 114' is removed. In an embodiment of the present invention, the removal of via filling material 114' is a two (2) step process: (1) a first step of removing carbon depletion region 120, and (2) a second step of removing the residual via filling material 114'. Since residual via filling material 114' is an organo-siloxane in one embodiment, it may be conventionally removed using a wet etch process. However, since under these exemplary conditions, the carbon depletion region 120 has inorganic properties, it cannot be easily removed by a wet etch using conventional etchant solutions. Conventional etchant solutions will leave etch residues. Further, if the wet etch process time is increased to compensate for the removal of carbon depletion region 120, interlayer insulating layer 106, which is formed of OSG material, may be damaged. Thus, in order to remove the residual via filling material 114' without leaving an etch residue, it is necessary to perform an additional process to remove carbon depletion region 120.

In an embodiment of the present invention, as shown in FIG. 5, a first wet etch (W1) is performed using an acidic etchant solution to remove carbon depletion region 120. As described above, carbon depletion region 120 has inorganic properties; therefore, carbon depletion region 120 can be easily removed with an acidic etchant solution. In a preferred embodiment of the present invention, the acidic solution is an etchant containing hydrofluoric acid (HF).

Referring to FIG. 6, after removing carbon depletion region 120, the residual via filling material 114' is removed. A second wet etch (W2) using a conventional solution is used. In a preferred embodiment of the present invention, the solution is an etchant containing dimethyl acetamide ($CH_3CON(CH_3)_2$). The etchant for the second wet etch (W2) may include dimethyl acetamide as the main component, and may further include ammonium fluoride ($NH_4F$), ammonium acetate ($CH_3COONH_4$), or acetic acid ($CH_3COOH$).

Figure 7:
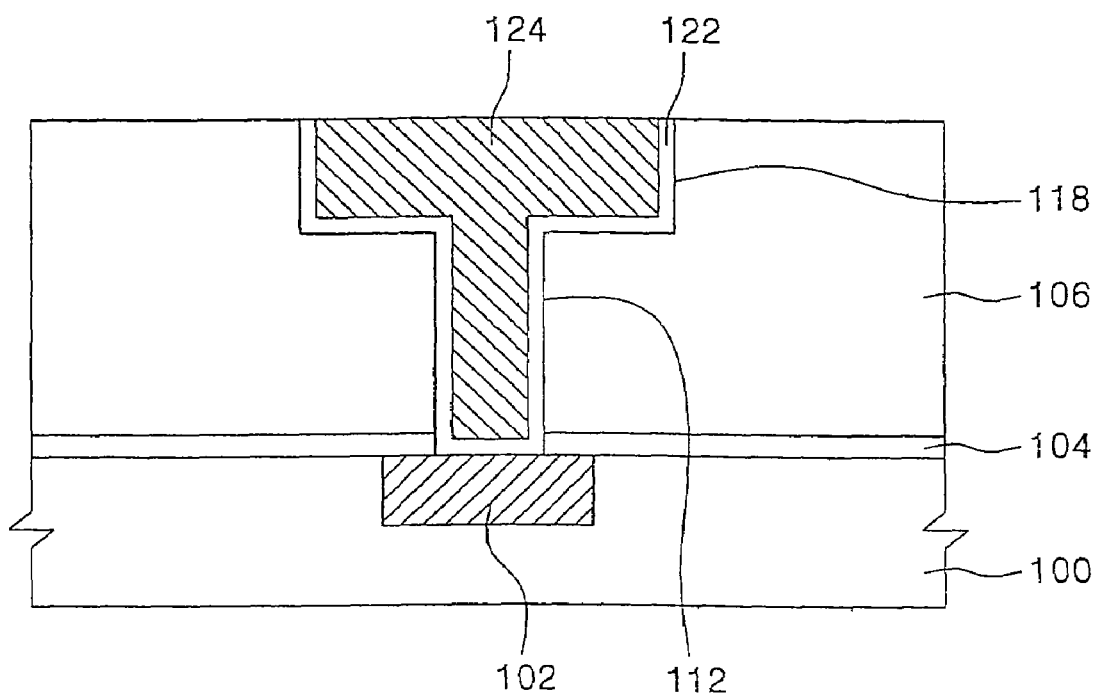

Referring to FIG. 7, after removing the residual via filling material 114', a portion of etch stop layer 104, exposed by via hole 112, is removed. In the case where etch stop layer 104 is a silicon nitride (SiN) layer, etch stop layer 104 can be removed by a wet etch solution using an etchant containing phosphoric acid ($H_3PO_4$). Then, a diffusion barrier layer 122 is preferably formed on the entire surface of the resultant structure including trench 118 and via hole 112. Diffusion barrier layer 122 is formed of one material layer or laminated layers of at least two materials selected from Ta, TaN, TaAlN, TaSiN, $TaSi_2$, Ti, TiN, WN, and TiSiN. Then, a conductive layer (not shown) for filling trench 118 and via hole 112 is formed. The conductive layer may be formed from copper or a copper alloy. Then, the conductive layer, diffusion barrier layer 122, and capping layer 108 are sequentially polished by a chemical mechanical polishing process to form a conductive layer pattern 124.

Figure 8A:
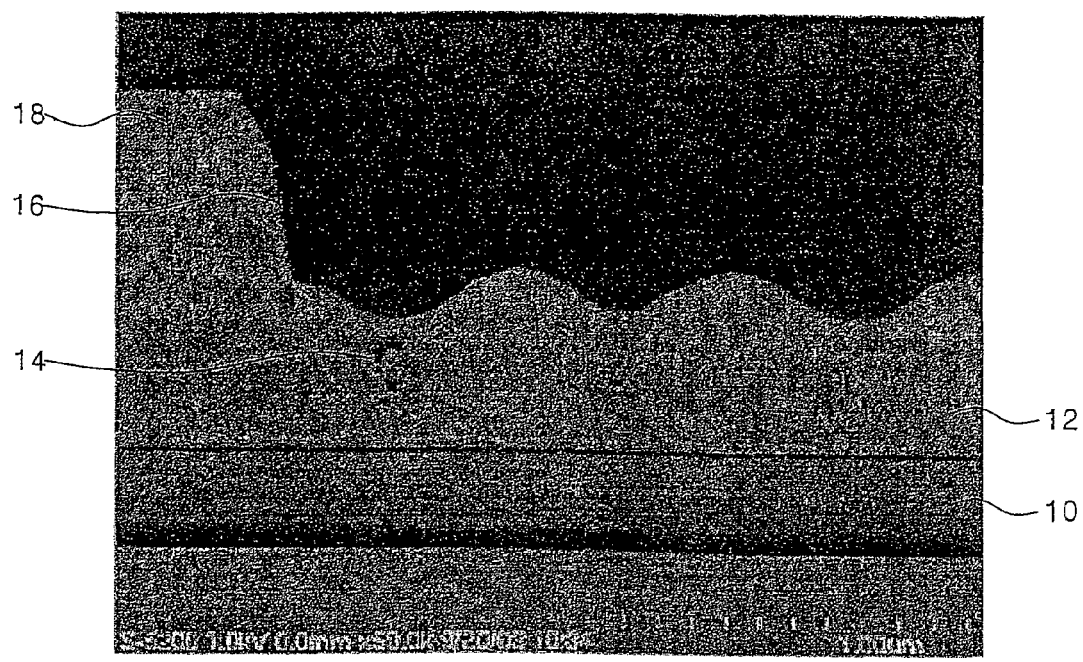
FIGS. 8a and 8b are SEM images of interconnection lines after a via filling material is removed using the conventional method.

Referring to FIG. 8a, an OSG interlayer insulating layer 12 was formed on a semiconductor substrate 10, and a via hole 14 was formed inside interlayer insulating layer 12. Then, an organo-siloxane via filling material was formed to fill via hole 14 using a spin-on method. The via filling material was formed on interlayer insulating layer 12 to a thickness of about 2000 Å. Then, a photolithography process and an etch process were performed to form a trench 16 connected to via hole 14. At this time, a residual portion of the via filling material 18 remained inside via hole 14 and on interlayer insulating layer 12. Next, an ashing process was performed to remove the photoresist pattern, and then, residual via filling material 18 was wet-etched using an acidic solution containing HF The wet etch was performed for about 30 seconds. As a result, an upper portion of residual via filling material pattern 18 on interlayer insulating layer 12 was etched by about 500 Å to reduce the thickness of the residual via filling material 18 to about 1500 Å. Although the wet etch was continuously performed, no further etching of residual via filling material 18 occurred.

Figure 8B:

Referring to FIG. 8b, performing the same process as that of FIG. 8a, an OSG interlayer insulating layer 22 was formed on a semiconductor substrate 20, and a via hole (not shown) was formed inside interlayer insulating layer 22. Then, an organo-siloxane via filling material was formed to fill the via hole using a spin-on method to a thickness of about 2000 Å. Then, a photolithography process and an etch process were performed to form a trench 24 connected to the via hole. At this time, a residual via filling material 26 remained inside the via hole and on interlayer insulating layer 22. Next, a photoresist pattern to form trench 24 was removed using an ashing process, and then, residual via filling material pattern 26 was wet-etched for about 3 minutes using a conventional solution containing dimethyl acetamide. As shown in FIG. 8b, the surface of residual via filling material 26 was not completely etched, but rather, etched by lifting-off its bottom portion due to necking.

Figure 9:
FIG. 9 is an SEM image of interconnection lines after a via filling material is removed according to method of the present invention.

Referring to FIG. 9, in order to remove the residual via filling material, a first wet etch process was performed for about 20 seconds, using an acidic solution containing HF, and then, a second wet etch process was performed for about 3 minutes, using a conventional solution containing dimethyl acetamide. As a result, as shown in FIG. 9, the residual via filling material on an interlayer insulating layer 32 and inside a via hole 34 were completely removed. Therefore, the result shows that the residual via filling material may be effectively and rapidly removed using a method according to the present invention. A reference numeral "30" in FIG. 9 represents a semiconductor substrate.

What is claimed is:

1. A method of fabricating interconnection lines for a semiconductor device, comprising:
    forming a conductive layer on a semiconductor substrate;
    forming an etch stop layer on the conductive layer;
    forming an interlayer insulating layer on the etch stop layer;
    forming a via hole through the interlayer insulating layer to expose the etch stop layer;
    forming a via filling material on the interlayer insulating layer to fill the via hole;
    forming a photoresist pattern on the via filling material;
    anisotropically etching the via filling material and the interlayer insulating layer using the photoresist pattern as an etch mask to form a trench connected to the via hole;
    removing the photoresist pattern using an ashing process, wherein the ashing process converts a surface portion of the via filling material to a carbon depletion region;
    performing a first wet etch process using a first wet etch solution to remove the carbon depletion region;
    performing a second wet etch process using a solution of dimethyl acetamide, different from the first wet etch solution to remove a residual portion of the via filling material filling the via hole; and
    forming a conductive layer pattern to fill the via hole and the trench with a conductive material.

2. The method according to claim 1, wherein the interlayer insulating layer is formed of organo silicate glass (OSG).

3. The method according to claim 2, wherein the via filling material is a filling material of organo-siloxane.

4. The method according to claim 1, further comprising forming a capping layer on the interlayer insulating layer.

5. The method according to claim 4, wherein the capping layer is formed of undoped silicate glass (USG), fluorinated silicate glass (FSG), or tetra ethyl ortho silicate (TEOS).

6. The method according to claim 1, wherein the first wet etch process uses a solution of Hydrofluoric acid (HF).

7. The method according to claim 1, wherein the solution further comprises a chemical selected from a group consisting of ammonium fluoride, ammonium acetate, acetic acid, and a combination thereof.

8. The method according to claim 1, wherein forming the conductive layer pattern comprises:
    forming a conductive layer to completely fill the via hole and the trench; and
    polishing the conductive layer using a chemical-mechanical polishing to expose the interlayer insulating layer.

9. A method of fabricating interconnection lines for a semiconductor device, comprising:
    forming a conductive layer on a semiconductor substrate;
    forming an etch stop layer on the conductive layer;
    forming an interlayer insulating layer on the etch stop layer;
    forming a via hole through the interlayer insulating layer to expose the etch stop layer;
    forming a via filling material on the interlayer insulating layer and in the via hole;
    forming a photoresist pattern on the via filling material;
    anisotropically etching the via filling material and the interlayer insulating layer, using the photoresist pattern as an etch mask to form a trench connected to the via hole;
    removing the photoresist pattern using an ashing process, wherein the ashing process converts a surface portion of the filling material to a carbon depletion region;
    performing a first wet etch process using a solution comprising Hydrofluoric acid (HF) to remove the carbon depletion region;
    performing a second wet etch process using a solution comprising dimethyl acetamide to remove a residual portion of via filling material filling the via hole; and
    forming a conductive layer pattern to fill the via hole and the trench with a conductive material.

10. The method according to claim 9, wherein the interlayer insulating layer is formed of organo silicate glass (OSG).

11. The method according to claim 10, wherein the via filling material is a filling material of organo-siloxane.

12. The method according to claim 9, further comprising forming a capping layer on the interlayer insulating layer.

13. The method according to claim 12, wherein the capping layer is formed of undoped silicate glass (USG), fluorinated silicate glass (FSG), or tetra ethyl ortho silicate (TEOS).

14. The method according to claim 9, wherein the solution used in the second wet etch process further comprises a chemical selected from a group consisting of ammonium fluoride, ammonium acetate, acetic acid, and a combination thereof.

15. The method according to claim 9, wherein forming the conductive layer pattern comprises:
    forming a conductive layer to completely fill the via hole and the trench; and
    polishing the conductive layer by a chemical mechanical polishing to expose the interlayer insulating layer.

16. The method according to claim 9, wherein the conductive layer pattern is copper or a copper alloy.

* * * * *